(12) United States Patent
Wang et al.

(10) Patent No.: US 10,864,666 B2
(45) Date of Patent: Dec. 15, 2020

(54) PACKAGING DEVICE OF ELECTRONIC COMPONENTS AND AN ENCAPSULATION METHOD THEREOF

(71) Applicant: Walsin Technology Corporation, Taipei (TW)

(72) Inventors: Kao-Yuan Wang, Taipei (TW); Nai-Chuan Chuang, Taipei (TW); Shih-Long Wei, Taipei (TW)

(73) Assignee: WALSIN TECHNOLOGY CORPORATION, Taipei (TW)

( * ) Notice: Subject to any disclaimer, the term of this patent is extended or adjusted under 35 U.S.C. 154(b) by 404 days.

(21) Appl. No.: 15/915,416

(22) Filed: Mar. 8, 2018

(65) Prior Publication Data
US 2019/0134865 A1   May 9, 2019

(30) Foreign Application Priority Data

Nov. 7, 2017   (TW) .............................. 106138485 A

(51) Int. Cl.
| | | |
|---|---|---|
| *B29C 45/14* | (2006.01) | |
| *B29C 45/00* | (2006.01) | |
| *H01L 23/31* | (2006.01) | |
| *H01L 21/56* | (2006.01) | |
| *B29C 45/37* | (2006.01) | |
| *B29K 63/00* | (2006.01) | |
| *B29K 105/20* | (2006.01) | |
| *B29K 509/02* | (2006.01) | |
| *B29L 9/00* | (2006.01) | |
| *B29L 31/34* | (2006.01) | |
| *H01C 17/00* | (2006.01) | |
| *H01F 41/00* | (2006.01) | |

(52) U.S. Cl.
CPC .... *B29C 45/14336* (2013.01); *B29C 45/0053* (2013.01); *B29C 45/0055* (2013.01); *B29C 45/14639* (2013.01); *B29C 45/37* (2013.01); *H01L 21/565* (2013.01); *H01L 23/3107* (2013.01); *B29C 2045/0058* (2013.01); *B29C 2045/0094* (2013.01); *B29K 2063/00* (2013.01); *B29K 2105/20* (2013.01); *B29K 2509/02* (2013.01); *B29K 2715/00* (2013.01); *B29K 2995/0003* (2013.01); *B29L 2009/005* (2013.01); *B29L 2031/3406* (2013.01); *B29L 2031/3487* (2013.01); *H01C 17/00* (2013.01); *H01F 41/00* (2013.01)

(58) Field of Classification Search
CPC ................................................ B29C 45/14336
See application file for complete search history.

*Primary Examiner* — Larry W Thrower
(74) *Attorney, Agent, or Firm* — Muncy, Geissler, Olds & Lowe, PC

(57) ABSTRACT

An encapsulation method of electronic components comprises steps as follows: preparing electronic components with cylindrical bodies wherein a cylindrical body has front and rear ends made of metals and a middle end made of ceramics and the front end or the rear end features an outer diameter greater than the middle end of the cylindrical body; preparing a mould consisting of upper and lower moulds; encasing the cylindrical bodies inside the upper and lower moulds, injecting heated and softened protective materials into the mould in which protective materials as protective layers are coated on the cylindrical bodies; injecting the cylindrical bodies removed from the upper and lower moulds into a roller in which excessive protective layers on the front and rear ends of the cylindrical bodies are de-coated.

5 Claims, 5 Drawing Sheets

PACKAGING DEVICE OF ELECTRONIC COMPONENTS AND AN ENCAPSULATION METHOD THEREOF

BACKGROUND OF THE INVENTION

1. Field of the Invention

The present disclosure relates to a packaging device of electronic components, particularly a packaging device of leadless electronic components and an encapsulation method thereof.

2. Description of the Prior Art

The integrated circuit packaging techniques which carry weight in manufacturing of electronic products or subassemblies that have grown sharply nowadays are being developed for miniaturization and high density. For that matter, PCBs on which miniaturized electronic components are mounted as required have evolved from plug-in printed circuit boards to surface-mounted printed circuit boards and conventional electronic components with metal pins in design have been upgraded to leadless electronic components for surface-mounted technologies.

In the manufacturing process of conventional MELF resistors, columnar resistors or leadless resistors, an ohmic columnar ceramic core should be capped with metal heads at both ends which will be spirally cut and trimmed with laser or blades once for the default resistance at a juncture; then, a polymer protective layer is printed on the columnar ceramic core with a roller. However, the protective layer coated on an electronic component probably covers the metal heads at both sides, imposing negative effect on reliability of an electronic component on which there might be some bubbles in protective layer during coating, and inducing surface depression over the ceramic core. For an electronic component uniformly wrapped by protective materials, the protective layers should be repeatedly coated on the electronic component during time/cost-wasting operation until an even surface is obtained satisfactorily.

Furthermore, polymer protective layers in which inorganic filler to decrease water absorption rate and increase heat conductivity is added may be overwhelmed by poor fluidity of materials and incompletely or unevenly coated on electronic components if the ratio of inorganic filler added is disproportionally high.

The above disadvantages derived from a manufacturing process of coatings on conventional electronic components have imperiled production yield rates and service lives of electronic components for a long time and deserve to be corrected with better solutions in place of current techniques.

SUMMARY OF THE INVENTION

In view of the above problems, an encapsulation method of electronic components provided in the present disclosure comprises steps as follows:

The first step is to prepare electronic components with cylindrical bodies wherein a cylindrical body has front and rear ends made of metals and a middle end made of ceramics and the front end or the rear end features an outer diameter greater than the middle end of the cylindrical body; the next step is to prepare a mould consisting of upper and lower moulds; the following step is to encase the cylindrical bodies inside the upper and lower moulds, inject heated and softened protective materials into the mould in which protective materials as protective layers are coated on the cylindrical bodies; the last step is to inject the cylindrical bodies removed from the upper and lower moulds into a roller in which excessive protective layers on the front and rear ends of the cylindrical bodies are de-coated.

A technical measure related to an encapsulation method of electronic components is to inject intermediates and electronic components into the roller for physical churns and collisions between the intermediates and the electronic components and removals of excessive protective layers on the cylindrical bodies.

Another technical measure related to an encapsulation method of electronic components is to select the intermediates from high-rigidity metal balls or ceramic balls.

Another technical measure related to an encapsulation method of electronic components features the protective materials made of epoxy and inorganic filler which accounts for more than 50%.

Another technical measure related to an encapsulation method of electronic components is to select the inorganic filler from nitrides, oxides or a combination thereof.

The present disclosure is also to provide a packaging device of electronic components which comprises a mould.

The mould comprises an upper mould and a lower mould combined with or detached from the upper mould wherein the upper mould has a plurality of upper grooves thereon which are opposite to a plurality of lower grooves on the lower mould and electronic components are accommodated in the upper and lower grooves.

A technical measure related to a packaging device of electronic components is characteristic of an electronic component comprising a cylindrical body which features a front end, a rear end opposite to the front end, and a middle end between the front end and the rear end and presents electric properties.

Another technical measure related to a packaging device of electronic components is characteristic of the electronic component which is a leadless inductor or resistor.

Another technical measure related to a packaging device of electronic components is characteristic of a roller in which the cylindrical bodies are injected and the intermediates are fed separately such that physical churns and collisions are available to both the cylindrical bodies and the intermediates inside the roller.

Another technical measure related to a packaging device of electronic components is characteristic of the upper mould, which comprises an injection hole, an upper major runner linking the injection hole and a plurality of upper minor runners, each of them is located between two adjacent upper grooves and interlinked with the upper major runner, and the lower mould, which comprises a lower major runner opposite to the upper major runner and a plurality of lower minor runners, each of them is located between two adjacent lower grooves and interlinked with the lower major runner.

A packaging device of electronic components and an encapsulation method thereof are effective in encasing electronic components inside the upper and lower moulds for a thermoforming process and injecting the protective materials into the mould in which the protective materials as the protective layers are coated on the cylindrical bodies once for all and gases are exhausted during the thermoforming process for the electronic components with flat, smooth and protected surfaces and promotion of yield rates and service lives. Moreover, a packaging device of electronic components and an encapsulation method thereof depend on the roller in which high-rigidity intermediates and the electronic components are injected for physical churns and collisions in between to remove excessive whole protective layers on the front and rear ends in simplified processing; on the other hand, the electronic components on which protective materials with inorganic filler accounting for more than 50% are coated uniformly for lower water absorption and higher thermal conductivity make device have better reliability.

BRIEF DESCRIPTION OF THE DRAWINGS

The technical content, purposes and effects of a packaging device of electronic components and an encapsulation method thereof are further explained in the preferred embodiment and accompanying drawings which are shown as follows.

DETAILED DESCRIPTION OF THE PREFERRED EMBODIMENT

The characteristics and technical contents of a packaging device of electronic components and an encapsulation method thereof are clearly explained in the preferred embodiment and accompanying drawings as follows.

Figure 1:
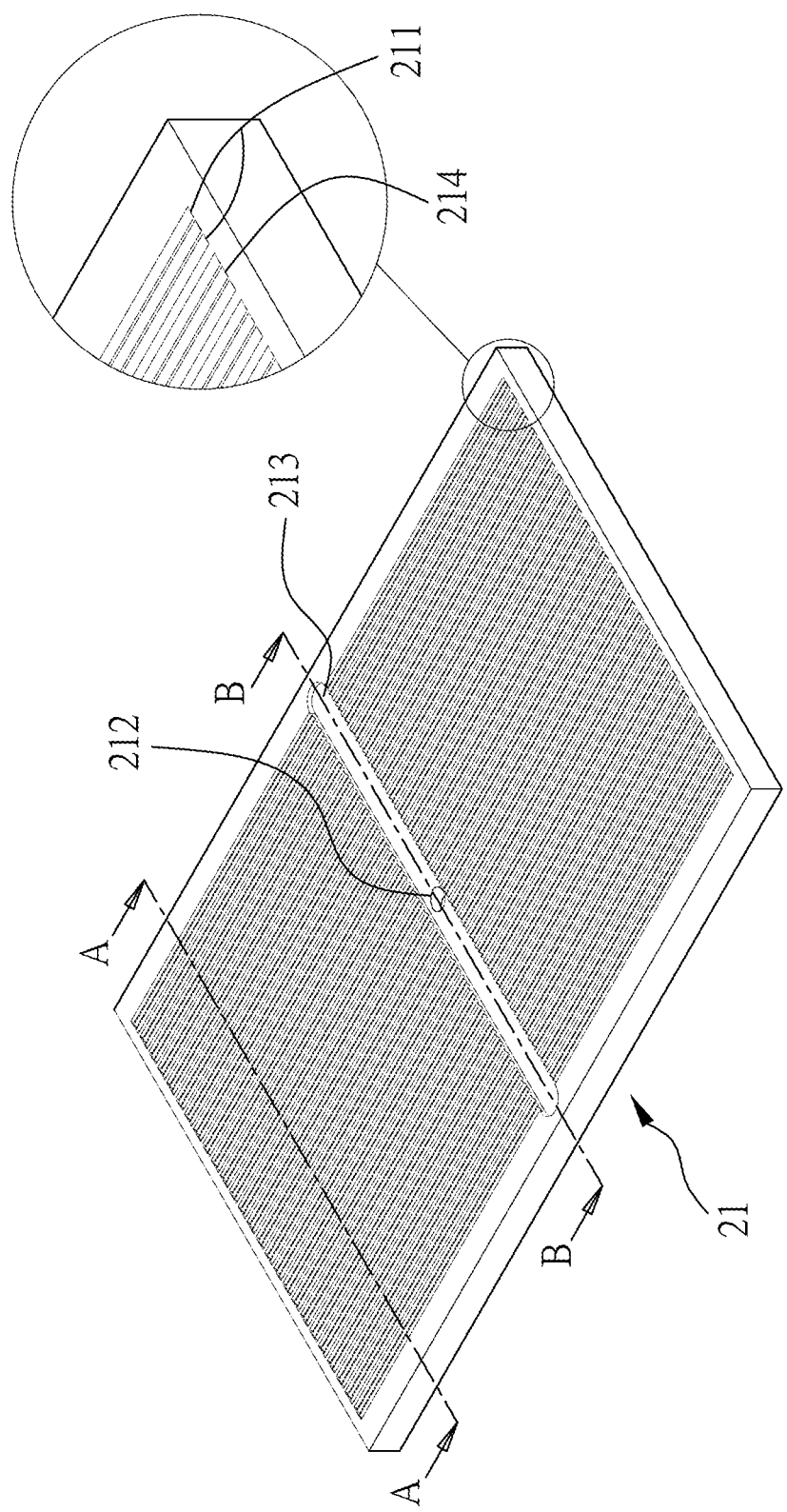
FIG. 1 is a schematic perspective view illustrating an upper mould in a packaging device of electronic components in a preferable embodiment.
Figure 2:
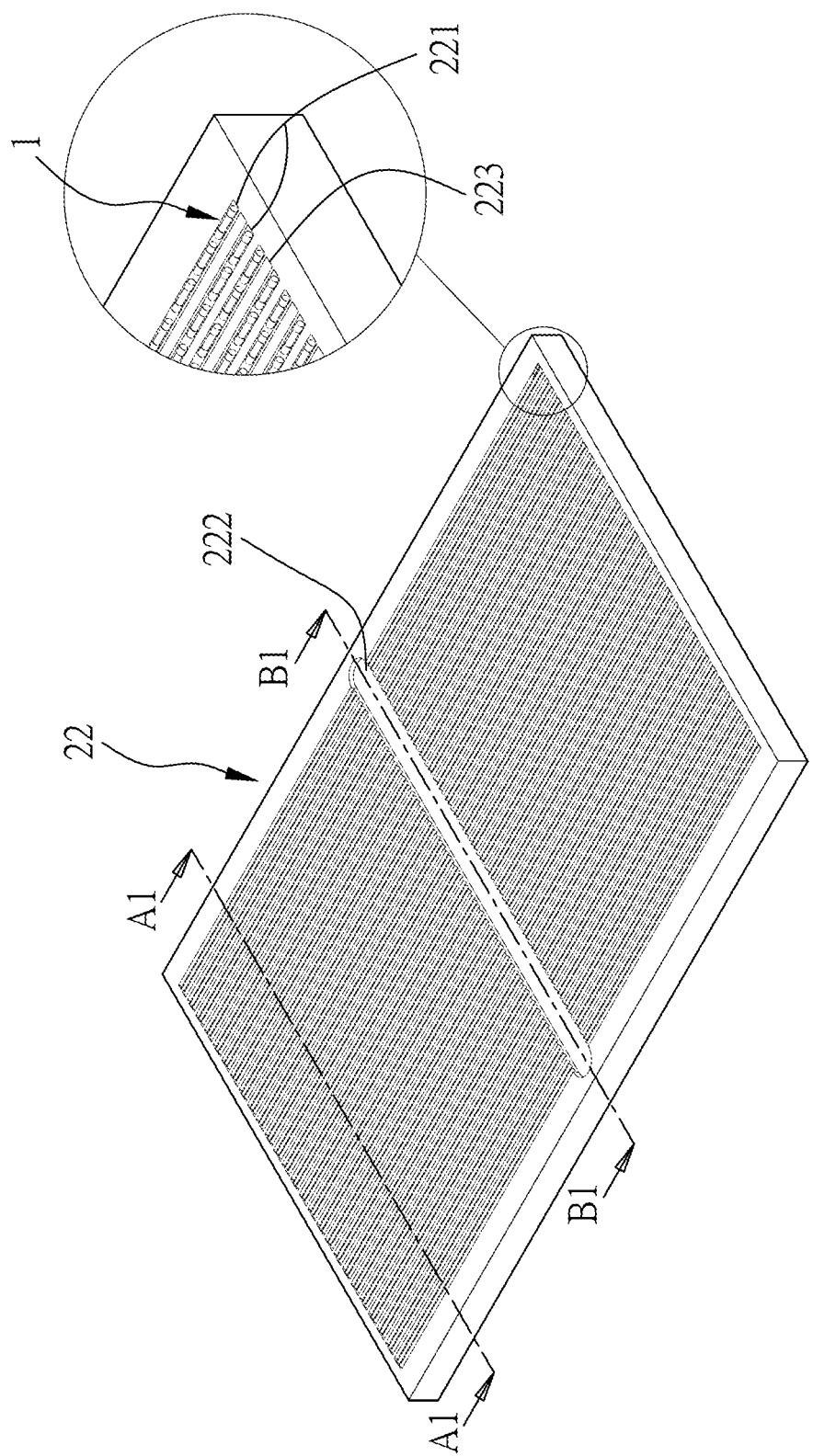
FIG. 2 is a schematic perspective view illustrating a lower mould in a packaging device of electronic components in a preferable embodiment.
Figure 3:
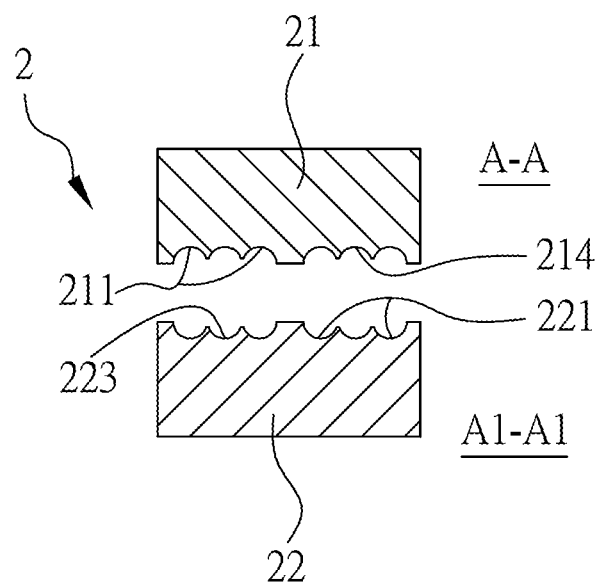
FIG. 3 is a combination of a sectional view for Line A-A in FIG. 1 as well as a sectional view for Line A1-A1 in FIG. 2 and illustrates the upper mould is combined with the lower mould in a preferable embodiment.

Referring to FIGS. 1, 2 and 3, which illustrate a packaging device of electronic components and an encapsulation method of electronic components wherein a packaging device of electronic components 1 comprises a mould 2, a roller 3 and intermediates 4.

An electronic component 1 comprises a cylindrical body 11 which has a front end 111, a rear end 112 opposite to the front end 111, and a middle end 113 between the front end 111 and the rear end 112 and features electric properties. In the preferable embodiment, the electronic component 1 can be a cylindrical leadless inductor or resistor.

The mould 2 comprises an upper mould 21 and a lower mould 22 combined with or detached from the upper mould 21 wherein a plurality of upper grooves 211 cut on the upper mould 21 are opposite to a plurality of lower grooves 221 cut on the lower mould 2 and an electronic component 1 is accommodated in the upper and lower grooves 211, 221 of the upper and lower moulds 21, 22, both of which are matching each other.

Furthermore, the upper mould 21 further comprises an injection hole 212, an upper major runner 213 linking the injection hole 212, and a plurality of upper minor runners 214, each of which is located between two adjacent upper grooves 211 and interlinked with the upper major runner 213; the lower mould 22 further comprises a lower major runner 222 opposite to the upper major runner 213 and a plurality of lower minor runners 223, each of which is located between two adjacent lower grooves 221 and interlinked with the lower major runner 222.

Figure 4:
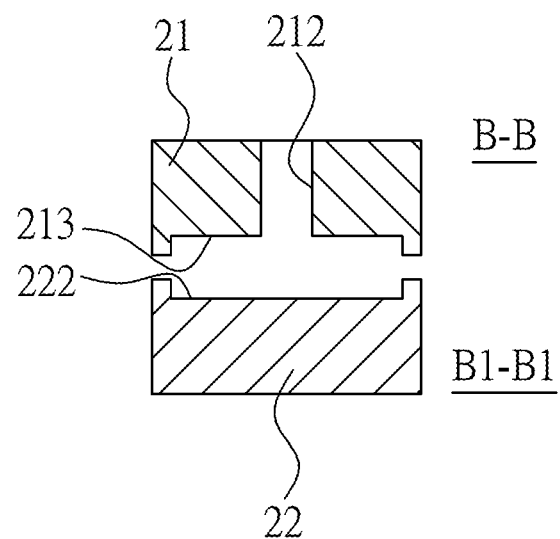
FIG. 4 is a combination of a sectional view for Line B-B in FIG. 1 as well as a sectional view for Line B1-B1 in FIG. 2 and illustrates the upper mould is combined with the lower mould in another preferable embodiment.
Figure 5:
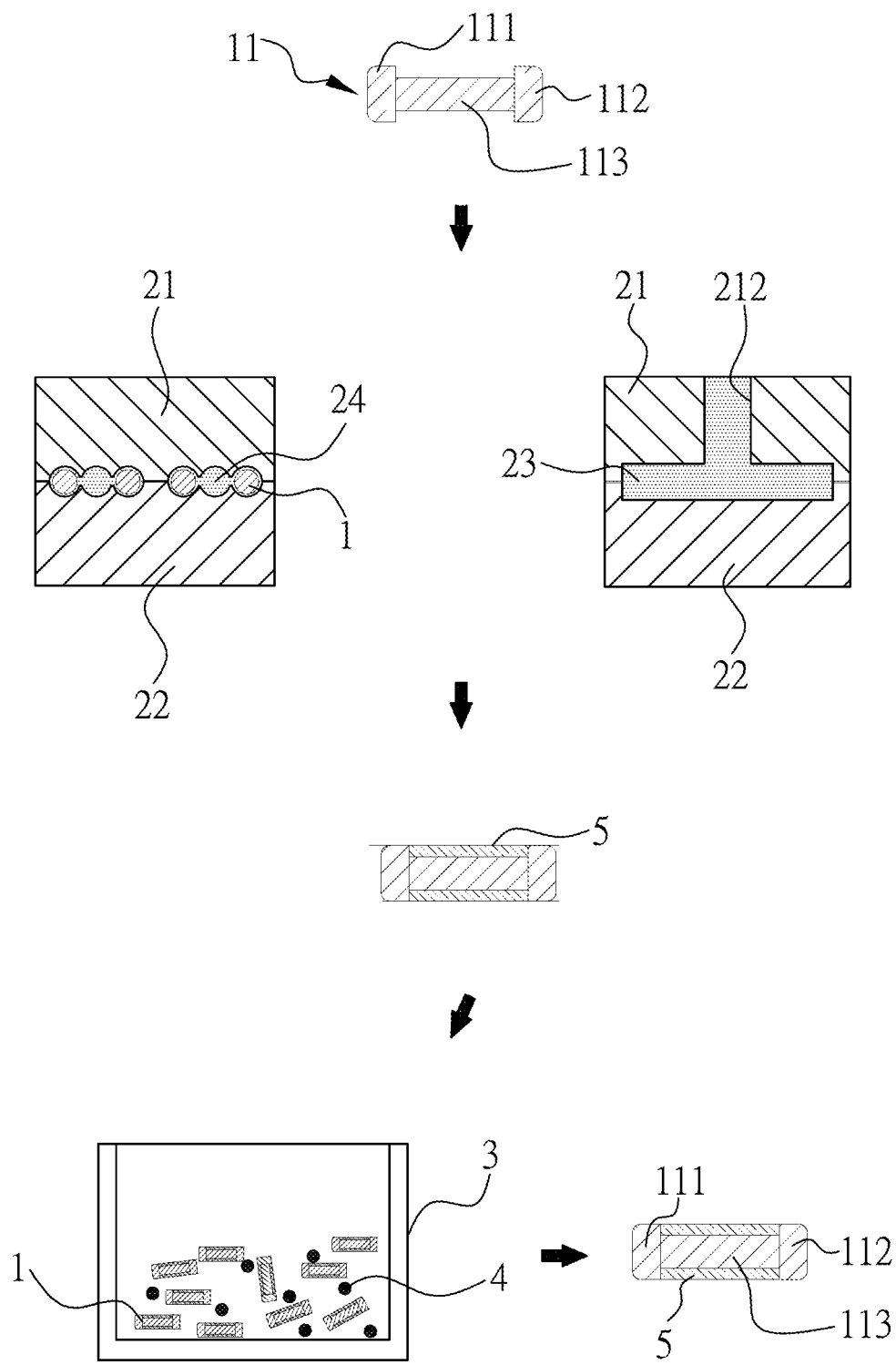
FIG. 5 is a schematic view illustrating a process for an encapsulation method of electronic components.

Referring to FIGS. 4 and 5, which illustrate both the upper major runner 213 and the lower major runner 222 constitute a first flow path 23 and both the upper minor runners 214 and the lower minor runners 223 constitute second flow paths 24 such that the first and second flow paths 23, 24 become flow paths of protective materials.

The roller 3 is a tool in which the cylindrical bodies 11 are injected and the intermediates 4 are fed separately such that physical churns and collisions are available to both the cylindrical bodies 11 and the intermediates 4 inside the roller 3.

Figure 6:
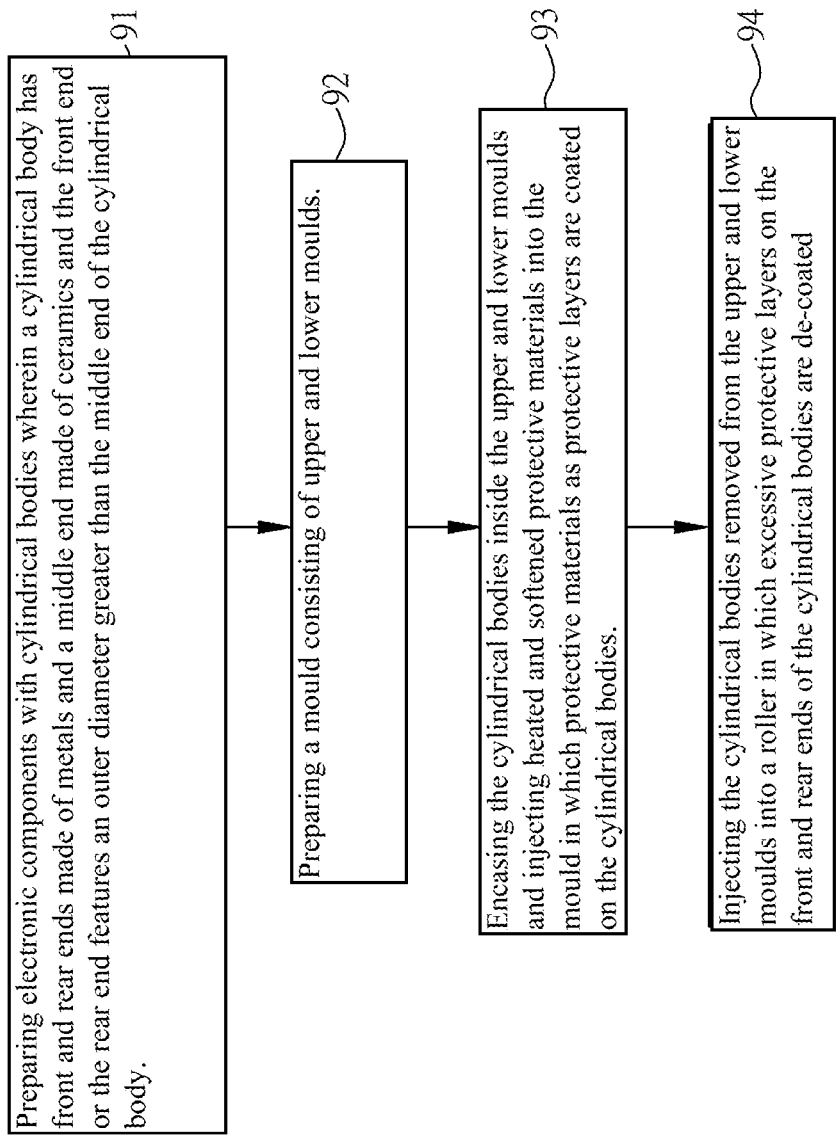
FIG. 6 is a schematic view illustrating steps of an encapsulation method of electronic components.

Referring to FIG. 6, which illustrates steps in an encapsulation method of electronic components as follows:

The first step is Step 91: Preparing an electronic component 1 with the cylindrical body 11 wherein the cylindrical body 11 features the front and rear ends 111, 112 made of metals and the middle end 113 made of ceramics with electric properties and each of the front and rear ends 111, 112 at the cylindrical body 11 has an outer diameter greater than the middle end 113 of the cylindrical body 11.

The next step is Step 92: Preparing the mould 2 with the upper and lower moulds 21, 22 wherein the mould 2 is applicable to encapsulation of protective layers on a plurality of electronic components 1 in each batch.

The following step is Step 93: Encasing the cylindrical bodies 11 inside the upper and lower moulds 21, 22; heating and softening protective materials as liquid substances and applying pressure to inject the liquid protective materials into the mould 2 for a thermoforming process during which protective materials as protective layers 5 are coated on the cylindrical bodies 11, temperatures heating protective materials range from 50 to 250 degrees Celsius, and pressures injecting the liquid protective materials into the mould 2 are controlled from 5 to 50 Kg/cm$^2$.

The protective materials which are being injected into the mould 2 from the injection hole 212 on the upper mould 21 will be guided into a plurality of interlinked second flow paths 24 and further the upper and lower grooves 211, 221 at both sides from the first flow path 23 such that the electronic components 1 inside the upper and lower grooves 211, 221 are wrapped with the protective materials for development of the protective layers 5 in a follow-up thermoforming process.

Specifically, an upper minor runner 214 between two upper grooves 211 and a lower minor runner 223 between two lower grooves 221 are lower than the two adjacent upper grooves 211 and the two adjacent lower grooves 221 in height, respectively. Furthermore, both the two upper grooves 211 and an upper minor runner 214 or both the two lower grooves 221 and a lower minor runner 223 are interlinked with each other for development of a triple groove unit in design by which a second flow path 24 is not blocked by an upper minor runner 214 and a lower minor runner 223, both of them join together, when the upper and lower moulds 21, 22 are matching each other; instead, protective materials inside the second flow paths 24 are guided into the upper and lower grooves 211, 221 sideward via gaps reserved by the upper minor runners 214 and the lower minor runners 223 such that electronic components 1 inside the upper and lower grooves 211, 221 are wrapped by protective materials effectively.

Moreover, the second flow paths 24 developed by the upper minor runners 214 and the lower minor runners 223 are not only paths in which protective materials are circulated but also unload grooves from which electronic components 1 orderly arranged inside the upper and lower grooves 211, 221 are fetched by an operator conveniently after completion of a thermoforming process.

Preferably, the protective materials are made of epoxy and inorganic filler which accounts for more than 50% and is selected from nitrides, oxides or a combination thereof.

The protective layers 5 are developed on surfaces of the cylindrical bodies 11 in a thermal compression sealing process during which gases are exhausted but no bubble is derived from protective materials to surfaces of electronic components 1 for electronic components 1 with flat, smooth and protected surfaces and promotion of yield rates and service lives.

Furthermore, in a thermoforming process that protective materials with inorganic filler accounting for at least 50% are filled into the mould 2, no poor fluidity induced by high-proportion inorganic filler is observed but uniform coatings, lower water absorption and higher thermal conductivity are available such that electronic components 1 wrapped by the protective layers 5 make device have better reliability.

Additionally, the front end 111 or the read end 112 of a cylindrical body 11 features an outer diameter greater than the middle end 113 of the cylindrical body 11 so that the middle end 113 as well as the front and rear ends 111, 112 constitute a plane with surface depression at the center. Based on a thermal compression sealing process, the protective layer 5 is uniformly coated on a cylindrical body 11 once for all and flattens the middle end 113 as well as the front and rear ends 111, 112 in contrast to a conventional technique which thickens and flattens surfaces by printing protective materials repeatedly.

In practice, the sizes of the upper and lower grooves 211, 221 in which electronic components 1 are accommodated can be changed to satisfy the sizes of cylindrical bodies 11 of electronic components 1 inside the upper and lower moulds 21, 22, both of them have matched each other.

The final step is Step 94: Injecting the cylindrical bodies 11 removed from the upper and lower moulds 21, 22, the intermediates 4 selected from high-rigidity metal balls or ceramic balls, and the electronic components 1 into the roller 3 for physical churns and collisions during which excessive protective layers 5 at the front and rear ends 111, 112 of the cylindrical bodies 11 are de-coated but protective layers 5 on the middle ends 113 are reserved.

It is unsatisfactory to attach the protective layers 5 made of epoxy and inorganic filler on the metal front and rear ends 111, 112 of the cylindrical bodies 11. Accordingly, the excessive whole protective layers 5 on the front and rear ends 111, 112 should be removed by high-rigidity intermediates 4 without any complicated operation in a conventional technique which relies on laser or blades to cut excessive protective layers 5.

In summary, a packaging device of electronic components and an encapsulation method thereof feature a thermal compression sealing process in which the protective layers 5 are coated on the cylindrical bodies 11 and gases are exhausted from surfaces of the cylindrical bodies 11 for electronic components 1 with flat, smooth and protected surfaces and the protective layers 5 uniformly coated on the cylindrical bodies 11 inside the upper and lower moulds 21, 22 in a thermoforming process once for all.

Furthermore, with the electronic components 1 and the intermediates 4 injected into the roller 3 for physical churns and collisions, the excessive protective layers 5 on the front and rear ends 111, 112 of the cylindrical bodies 11 can be de-coated; protective materials with inorganic filler accounting for more than 50% undergo a thermoforming process in the mould 2 and contribute to uniform coatings, lower water absorption and higher thermal conductivity with which the electronic components 1 make device have better reliability. as required in the present disclosure.

The above descriptions explain the preferred embodiment in the present disclosure; however, the embodiment is not intended to limit the scope of the patent application. Any equivalent modification or change without departing from the spirit of the patent specification should be incorporated in the claims thereinafter. Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. An encapsulation method of electronic components, comprising steps as follows:
    preparing electronic components with cylindrical bodies wherein a cylindrical body has front and rear ends made of metals and a middle end made of ceramics and the front end or the rear end features an outer diameter greater than the middle end of the cylindrical body;
    preparing a mould consisting of upper and lower moulds;
    encasing the cylindrical bodies inside the upper and lower moulds, injecting heated and softened protective materials into the mould in which protective materials as protective layers are coated on the cylindrical bodies; and
    injecting the cylindrical bodies removed from the upper and lower moulds into a roller in which excessive protective layers on the front and rear ends of the cylindrical bodies are de-coated.

2. The encapsulation method of electronic components as claimed in claim 1 wherein intermediates are injected into the roller for physical churns and collisions between the intermediates and the electronic components and removals of excessive protective layers on the cylindrical bodies.

3. The encapsulation method of electronic components as claimed in claim 2 wherein the intermediates are selected from high-rigidity metal balls or ceramic balls.

4. The encapsulation method of electronic components as claimed in claim 3 wherein the protective materials are made of epoxy and inorganic filler which accounts for more than 50%.

5. The encapsulation method of electronic components as claimed in claim 4 wherein the inorganic filler is selected from nitrides, oxides or a combination thereof.

* * * * *